United States Patent
Mutikainen et al.

(10) Patent No.: US 10,384,929 B2
(45) Date of Patent: Aug. 20, 2019

(54) IMPACT ELEMENT FOR A SENSOR DEVICE AND A MANUFACTURING METHOD

(71) Applicant: MURATA MANUFACTURING CO., LTD., Nagaokakyo-shi, Kyoto (JP)

(72) Inventors: Risto Mutikainen, Espoo (FI); Juha Lahdenperä, Espoo (FI)

(73) Assignee: MURATA MANUFACTURING CO., LTD., Nagaokakyo-shi, Kyoto (JP)

( * ) Notice: Subject to any disclaimer, the term of this patent is extended or adjusted under 35 U.S.C. 154(b) by 401 days.

(21) Appl. No.: 15/405,558

(22) Filed: Jan. 13, 2017

(65) Prior Publication Data
US 2019/0002276 A1    Jan. 3, 2019

(30) Foreign Application Priority Data
Mar. 22, 2016    (FI) ...................... 20165237

(51) Int. Cl.
*B81B 7/00*    (2006.01)
*B81B 3/00*    (2006.01)
*B81C 1/00*    (2006.01)

(52) U.S. Cl.
CPC .......... *B81B 7/0022* (2013.01); *B81B 3/0051* (2013.01); *B81C 1/0038* (2013.01);
(Continued)

(58) Field of Classification Search
CPC ............ B81C 1/00984; B81C 1/00976; B81C 2201/115; B81B 3/0008; B81B 2207/015;
(Continued)

(56) References Cited

U.S. PATENT DOCUMENTS 6,151,967 A    11/2000  McIntosh et al.
6,938,485 B2    9/2005  Kuisma et al.
(Continued)

FOREIGN PATENT DOCUMENTS

EP    2 299 584 A1    3/2011
EP    2 746 217 A1    6/2014
(Continued)

OTHER PUBLICATIONS

J. Robertson, "Diamond-Like Amorphous Carbon", Materials Science and Engineering R 37, Reports: A Review Journal. (2002) pp. 129-281.
(Continued)

*Primary Examiner* — Francis C Gray
(74) *Attorney, Agent, or Firm* — Squire Patton Boggs (US) LLP

(57) ABSTRACT

A sensor device and a method for manufacturing the sensor device. The sensor device is equipped with an impact element that includes an inner part of dielectric bulk material and an outer part of diamond-like coating material. The inner part is made to be lower at the edges than in the middle, and the outer part is formed of a diamond-like coating layer that covers the inner part. The DLC coated impact element is mechanically more robust than the rectangular prior art structures. Furthermore, the tapered form of the impact element improves conductivity of the DLC coating such that discharge of static buildup in the impact element is effectively enabled.

14 Claims, 7 Drawing Sheets

(52) U.S. Cl.
CPC ...... *B81C 1/00531* (2013.01); *B81C 1/00674* (2013.01); *B81B 2201/025* (2013.01); *B81B 2201/0221* (2013.01)

(58) Field of Classification Search
CPC ............... H01L 21/76838; H01L 23/48; H01L 2924/0002; H01L 2924/00
See application file for complete search history.

(56) References Cited

U.S. PATENT DOCUMENTS

| | | | | |
|---|---|---|---|---|
| 7,919,362 | B2* | 4/2011 | Bolis | B81C 1/00333 361/824 |
| 9,136,165 | B2* | 9/2015 | Zhang | H01L 21/76838 |
| 2002/0113549 | A1* | 8/2002 | Yamazaki | H01L 51/5259 313/506 |
| 2009/0188709 | A1* | 7/2009 | Kojima | B81C 1/00476 174/260 |
| 2010/0052112 | A1* | 3/2010 | Rogers | B81B 7/0093 257/625 |
| 2011/0300770 | A1* | 12/2011 | Fukuda | B32B 15/08 445/58 |
| 2013/0127036 | A1 | 5/2013 | Kuo et al. | |
| 2014/0264646 | A1 | 9/2014 | Cohen et al. | |
| 2014/0353774 | A1 | 12/2014 | Zhang | |

FOREIGN PATENT DOCUMENTS

| | | |
|---|---|---|
| EP | 2 746 218 A1 | 6/2014 |
| EP | 2 805 913 A1 | 11/2014 |
| JP | H06151889 A | 5/1994 |
| JP | 2002321941 A | 11/2002 |
| JP | 2004025431 A | 1/2004 |
| JP | 2007160435 A | 6/2007 |
| JP | 2012008022 A | 1/2012 |
| JP | 2015175792 A | 10/2015 |
| WO | WO 2004/079373 A1 | 9/2004 |

OTHER PUBLICATIONS

European Search Report application No. EP 17 15 7344 dated Aug. 17, 2017.
Finnish Search Report dated Oct. 6, 2016 corresponding to Finnish Patent Application No. 20165237.

* cited by examiner

IMPACT ELEMENT FOR A SENSOR DEVICE AND A MANUFACTURING METHOD

BACKGROUND

The present disclosure relates to microelectromechanical sensors, and particularly to capacitive microelectromechanical sensors.

BACKGROUND OF THE DISCLOSURE

Microelectromechanical systems, or MEMS can be defined as miniaturized mechanical and electro-mechanical systems where at least some elements have a mechanical functionality. MEMS devices can be applied to quickly and accurately detect very small changes in physical properties.

Motion limiters are commonly used in MEMS devices to control the maximum distance that a movable structure inside a MEMS device can displace, or to dissipate energy in a controlled way in case a movable structure collides with an anchored structure inside a MEMS device. Such an impact may occur, for example, when a device is accidentally dropped to the floor on a manufacturing line. Design limits are also at risk during element testing.

Efficient motion limiting is quite complicated in structures where a planar movable mass is designed to undergo out-of-plane linear or rotary motion above or between other structural layers. It has proven difficult to create truly robust structure without significantly increasing the size or complexity of the configuration.

Document WO2004/079373 A1 discloses a capacitive acceleration sensor that comprises a movable electrode responsive to the acceleration, and a stationary electrode. The stationary electrode includes an isolator protrusion, which is coated with a diamond-like carbon (DLC, also known as amorphous carbon) layer. The disclosed layer structure of the motion limiter is very simple to manufacture, and the resulting sensor structure withstands wear very well.

One potential problem related to conventional structures is, however, buildup of static electricity at contact. The buildup is mainly generated to the protrusions through tribocharging. The triboelectric effect is a type of contact electrification in which certain materials become electrically charged after coming into contact with a different material. The polarity and strength of the charges produced differ according to the materials, surface roughness, temperature, strain, and other properties. The unpredictable buildup of static electricity tends to uncontrollably change internal electrical forces and thereby sensitivity and offset of the sensor device.

DLC coating is basically suitable to prevent wear of motion limiters because it is very resistant to abrasive and adhesive wear that takes place at contacts. The electrical conductivity of the DLC coating is relatively low and adjustable, but adequate to enable possibility to discharge triboelectrical charges. However, even with some DLC coated implementations, problems with buildup of static electricity may still occasionally appear.

SUMMARY

An object of the present disclosure is to provide an improved impact element for devices in which a planar inertial mass is suspended to undergo movement in the out-of-plane direction.

The objects of the disclosure are achieved by a sensor device and a method for manufacturing the sensor device, which are characterized by what is stated in the independent claims. The preferred embodiments of the disclosure are disclosed in the dependent claims.

The disclosure introduces the idea of manufacturing to the sensor device an impact element that includes an inner part of bulk material and an outer part of diamond-like coating material. The inner part is made to be lower at the edges than in the middle, and the outer part is formed of a diamond-like coating layer that covers the inner part. The cross-sectional form of the impact element is thus larger at the basis than at the top, so the DLC coated impact element is mechanically more robust than the rectangular prior art structures. Furthermore, the tapered form of the impact element improves conductivity of the DLC coating over the outer edges such that discharge of static buildup in the impact element center part contact area is significantly improved.

BRIEF DESCRIPTION OF THE DRAWINGS

In the following the disclosure will be described in greater detail by means of preferred embodiments with reference to the accompanying drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture with which various embodiments of the invention may be implemented. Only elements relevant for illustrating the embodiments are described in detail. Various components of microelectromechanical devices, which are generally known to a person skilled in the art, may not be specifically described herein.

Figure 1:
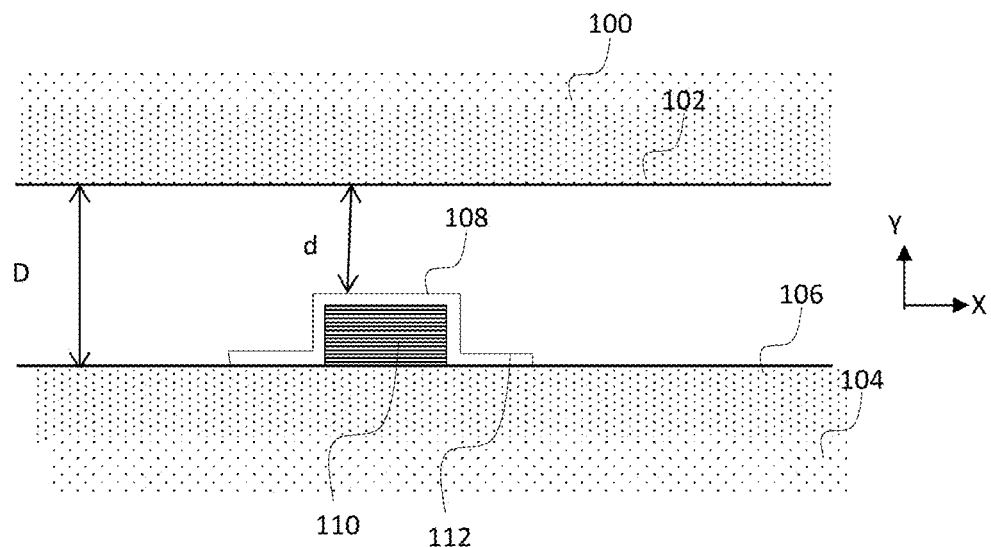
FIG. 1 illustrates basic structural elements of a prior art capacitive sensor device.

The schematic of FIG. 1 illustrates basic structural elements of a prior art capacitive sensor device. The device comprises an inertial mass 100 that carries a movable electrode 102. The term carry defines here a mechanical coupling between the movable electrode and the inertial mass such that when the inertial mass moves, the movable electrode moves with the inertial mass. The movable electrode provides an electrically conductive element and may consist of, for example, a structure patterned onto a surface of the inertial mass, or a conductive layer deposited on a surface of the inertial mass. Alternatively, the inertial mass itself may be formed of electrically conductive material and act as the electrically conductive element.

The device comprises also a base 104 that provides a stationary electrode 106 opposite the inertial mass. The base is rigidly coupled to the body of the device. In capacitive sensor devices, the inertial mass 100 is suspended to the base with a spring structure that enables the inertial mass to move in respect of the base 104 and thus in respect of the stationary electrode 106 provided by the base. Typically the suspending spring structure is ideally directional such that displacements of the inertial mass along one direction are enabled and displacements in other directions are disabled or at least very strongly damped. In the embodiment of FIG. 1, the base 104 and the stationary electrode 106 are planar and extend in a first direction (denoted with X). Similarly, the inertial mass 100 is planar and carries a movable electrode 102 that extends planarly in the first direction. The inertial mass is suspended to move out-of-plane, along the second direction (denoted with Y) that is perpendicular to the first direction. The inertial mass 102 may be suspended to move transversally along the second direction towards and away from the base 104. Alternatively, the inertial mass 102 may be suspended to rotate about an axis that is orthogonal in respect of both the first direction and the second direction such that the inertial mass moves along a slightly curved paths towards and away from the base 104. Spring structures enabling linear or rotational out-of-plane movement of movable mass are well known to a person skilled in the art and will not be elaborated herein.

As shown in FIG. 1, the base 104 includes an isolating impact element 108 that extends to a height in the second direction Y, towards the inertial mass 100 and the movable electrode 102. Due to this, a gap d is formed between a top surface of the impact element 108 and the surface of the movable electrode 102. The gap d of the impact element is smaller than a gap D formed between a surface of the movable electrode 102 and the surface of the stationary electrode 106. Accordingly, whenever the inertial mass 100 with movable electrode 102 moves towards the stationary electrode, a first impact will occur between the movable electrode 102 and the impact element 108.

The impact element includes an inner part 110 of bulk material and an outer part 112 of diamond-like coating material. The bulk material may be an insulating or highly resistive (slightly conductive) material, the resistivity of the bulk material being more than $10^{10}$ ohmmeters. Examples of bulk materials include silicon dioxide, silicon nitride, silicon oxynitride, ceramic thin film materials, aerogels, and the like. Abrasive and adhesive wear that takes place every time an impact occurs is already eliminated or reduced significantly by means of a DLC layer that covers only the top surface of the inner part 110. However, the DLC layer may be extended also beyond the edges of the inner part onto the area of the stationary electrode, as shown in FIG. 1. This way even a mildly conductive or semi-insulating DLC layer enables discharge of buildup electricity through the stationary electrode. It is noted that in the schematic drawings that illustrate impact elements, dimensions of the parts are shown out of their true proportions. Typically the DLC coating layer is very thin, a DLC coating on impact elements may be of the order of nanometers (e.g. 10 to 100 nm), while the height of the impact element typically varies in the range of micrometers (e.g. 0.5 to 1 micrometers).

However, as discussed earlier, in practice, adverse effects of static buildup may still occur occasionally. It has now been discovered that these adverse effects may be significantly reduced with an altered configuration of the impact element 108.

The DLC exists in various forms and there are several methods available to deposit DLC at surfaces. A widely used deposition method is plasma-enhanced chemical vapor deposition (PECVD). In chemical vapor deposition processes, a substrate is exposed to one or more gaseous or volatile precursors, which react or decompose on the substrate surface to produce the desired deposit. In plasma-enhanced chemical vapor deposition, plasma is used to enhance chemical reaction rates of the precursors. The higher mobility of electrons compared to that of ions in the plasma creates a sheath next to the electrodes with an excess of ions. Ionized atoms or molecules that diffuse to the edge of the sheath region experience an electrostatic force and are accelerated towards the neighboring surface. Thus, all surfaces exposed to the plasma receive energetic ion bombardment.

Article "Diamond-like amorphous carbon", J. Robertson, Materials Science and Engineering R 37 (2002), 129-281, describes that for DLC deposition, the plasma should be operated at the lowest possible pressure, in order to maximize the ion to radical fraction of the plasma, and to minimize collisions of the ions when being accelerated across the sheath. A lower pressure plasma can be created by using a magnetic field to confine the plasma such that the ion mean free path is comparable to or exceeds the sheath thickness and the ion energy becomes a narrow distribution. PECVD processes where such directional variation takes place are herein called as directed energy beam (or reactive mode) PECVD processes.

The intensity of the ion bombardment varies depending on device configuration of the applied PECVD process, and it is characteristic to (or dependent in details of) each PECVD configuration. For example, in some PECVD processes, the coated object is mounted on the grounded electrode, and the level of ion bombardment during the deposition process is moderate. In other processes, the coated object may be mounted on the rf-coupled electrode, which increases the level of ion bombardment. When the level of ion bombardment is higher, the properties of the resulting coating are also more varied, and adjustable by adjusting process parameters.

Figure 2:
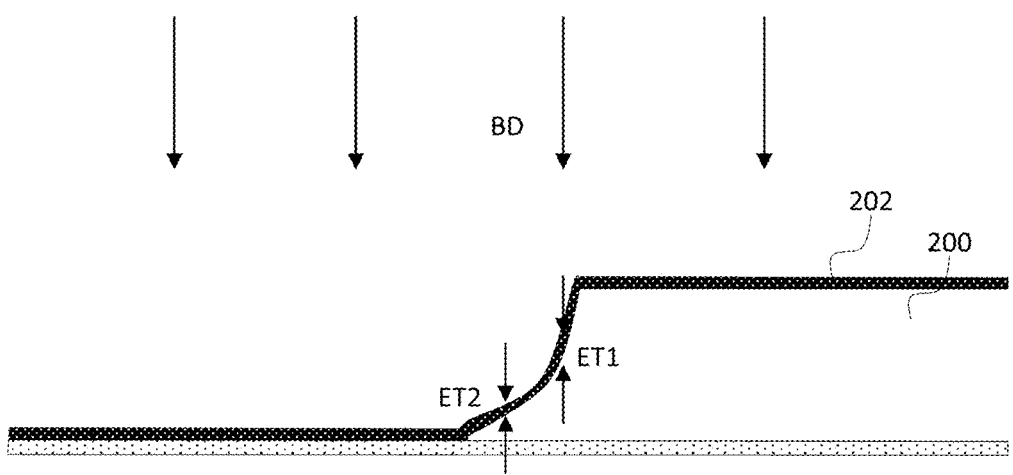
FIG. 2 illustrates an impact element coated with a DLC layer.

However, it has now been detected that in directed energy beam PECVD processes, conductivity of the resulting coating depends not only of the intensity of the ion bombardment but also on form factor of the deposited object. The ion bombardment and sub-plantation modifies the already grown DLC film surface at varying degree depending on the local slope of the sidewall. This different ion modification rate can lead to high reduction on DLC layer conductivity, by several orders of magnitude lower on steep sidewalls compared to shallow structure. FIG. 2 illustrates an impact element 200 coated with a DLC layer 202. As shown in FIG. 2, at regions where the side wall of the impact element 200 is aligned to, or almost parallel to the direction BD of the bombardment, the effective thickness ET1 of the DLC layer on the side wall is larger than the effective thickness ET2 of the DLC layer at regions where the side wall is more tilted in respect of the direction BD of the bombardment. Accordingly, by the specific tilting of the side walls of the impact element, conductivity of the DLC on the side walls of the impact element can be made to approach the bulk conductivity of the DLC layer in other parts of the impact element.

Figure 3:
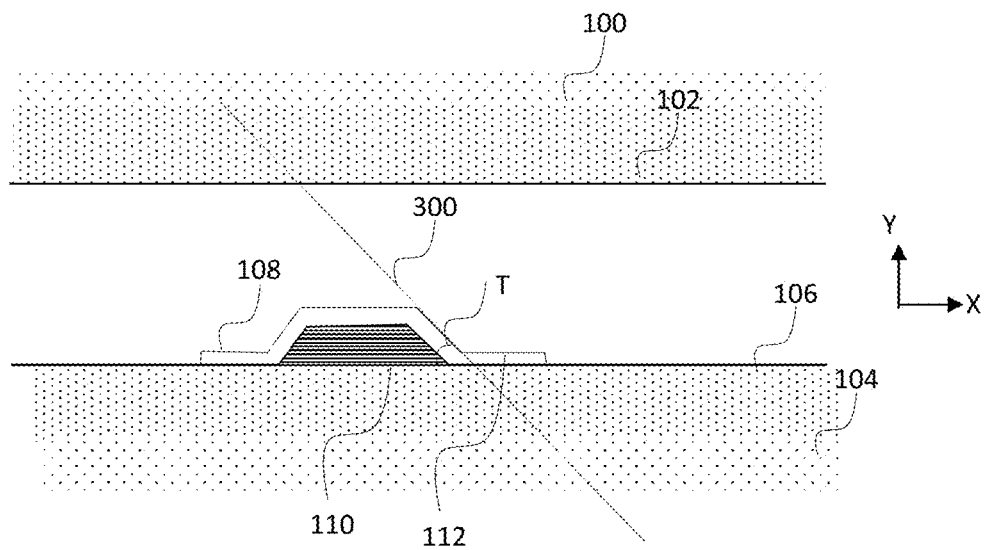
FIG. 3 illustrates an embodiment of an improved impact element.

FIG. 3 illustrates an embodiment of an improved impact element applying this finding. The corresponding parts have been referred to by same reference numerals as in FIG. 1. In the embodiment of FIG. 3, the bulky inner part 110 of the impact element 108 is manufactured to be lower at the edges than in the middle, and the outer part 112 of the impact element 108 is formed of a diamond-like coating layer that covers the top surface and the side walls of the inner part, and advantageously extends at least partly to the surface of the stationary electrode.

In the configuration of FIG. 1, the DLC deposited on sides of the inner part 110 is less conductive in the upright side walls than the DLC deposited in other parts of the DLC layer in the same process. In the configuration of FIG. 3, the DLC deposited on the sloped sides of the inner part 110 is nearly as conductive, or is as conductive as the DLC deposited in other parts of the DLC layer in the same process. By avoiding the deficient conductivity of the DLC along the side walls of the impact element, static electricity is more effectively discharged at impact (triboelectricity), and adverse effects of impact situations are consistently avoided.

Figure 4:
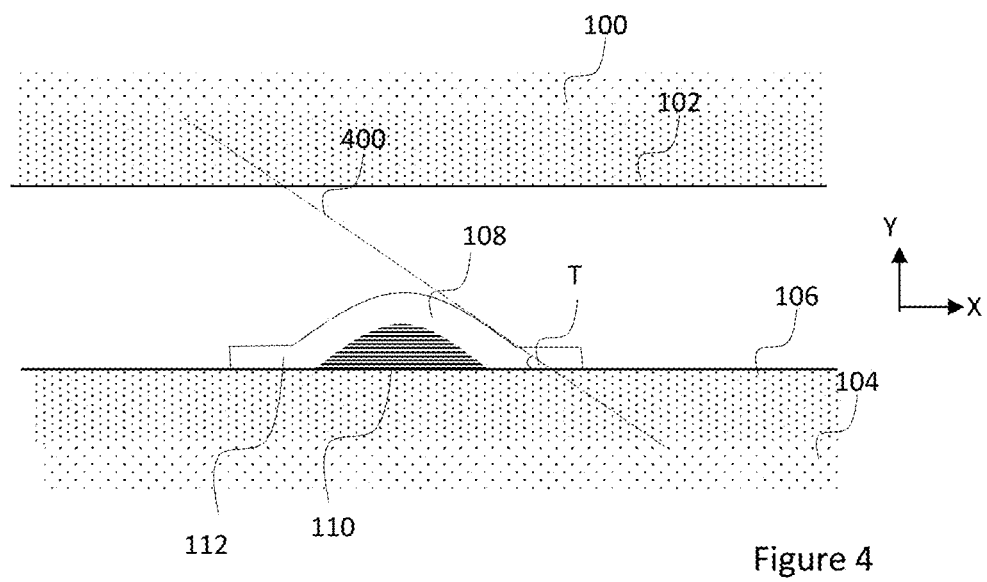
FIG. 4 illustrates another embodiment of an improved impact element.

The side walls of the impact element 108 may be substantially linear and tilted such that a line 300 running along the side wall in a cross-section forms a tilt angle T with the surface of the stationary electrode, as shown in FIG. 3. Alternatively, the side walls of the impact element 18 may have a curved form, as shown in FIG. 4. In a cross-section of such structure, an envelope of lines tangential to the side wall of the impact element 108 is formed. The tilt angle T of the side wall in this case is the largest angle formed by a tangent 400 of the curved surface with the surface of the stationary electrode, as shown in FIG. 3.

It has been detected that optimal performance in the resulting impact element is achieved with directed energy beam (or reactive mode) plasma enhanced chemical vapor deposition processes when the tilt angle T of the side walls of the impact element 108 is less than 80°, preferably less than 70°. On other DLC deposition methods the limit angle of preferential sidewall may be different.

The inner part with the specific tapered form combines with the diamond-like coating layer into an impact element that discharges static buildup significantly better and more reliably that prior art structures. Because of the form that broadens towards the base, the DLC coated impact element is also mechanically more robust than the right-angled prior art structures.

Figure 5:
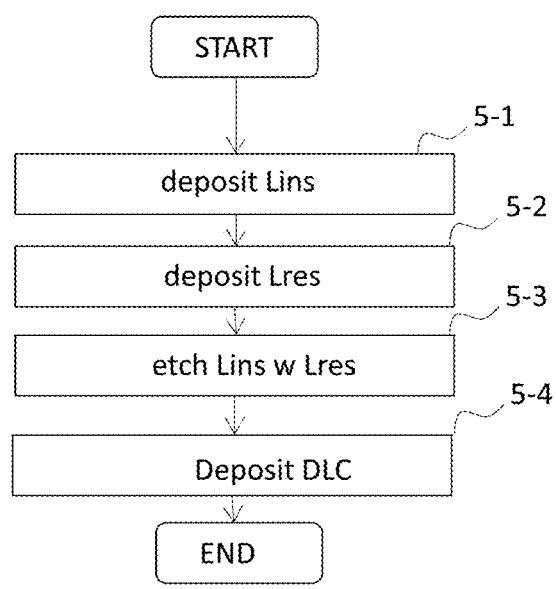
FIG. 5 provides an overview to a method for manufacturing the improved impact element.

The flow chart of FIG. 5 provides an overview to a method for manufacturing the specifically formed impact element described above and in FIGS. 3 and 4. The starting point of the process is an electrode substrate, a solid planar substrate with a conductive layer at least on the top surface of the substrate. Such element may be available commercially, or may be pre-produced by depositing a conductive coating on a semiconductor substrate in a manner well known to a person skilled in the art. For example aluminum layer on a silicon or glass semiconductor substrate may be applied as the electrode substrate.

In the beginning, a uniform layer Lins of the insulating or very weakly conductive bulk material may be deposited (stage 5-1) on the electrode substrate. As above, also this deposition stage is optional, a pre-processed wafer including the layer Lins of bulk material may be applied within the scope.

A photoresist layer element Lres is then created to a defined lateral position on the layer of bulk material Lins (stage 5-2). The creation of the photoresist layer element Lres may include, for example, deposition of a layer of photoresist material and patterning the deposited layer by ultraviolet exposure and development. The lateral position refers in general to a position of a surface region in the first direction, and the lateral position of the photoresist layer element is adjusted according to the desired lateral position of the resulting impact element.

The photoresist layer element Lres and the layer Lins of the bulk material are then etched (stage 5-3) to form a tapered element of bulk material. The element protrudes away from the planar electrode substrate, and its side walls are tilted in respect of the plane of the electrode substrate. Etching refers herein to a process where material is controllably removed from exposed surfaces of a wafer element. The resulting tapered element is lower at the edges than in the middle and thus forms the inner part 110 of the impact element 108 of FIGS. 3 and 4. A conductive diamond-like coating is deposited (stage 5-4) at least onto the tapered element of bulk material and into contact with the base. The conductive diamond-like coating is advantageously deposited with a directed energy beam plasma enhanced chemical vapor deposition process. The conductive diamond-like coating forms the outer part 112 of the impact element 108 of FIGS. 3 and 4.

Figure 6:
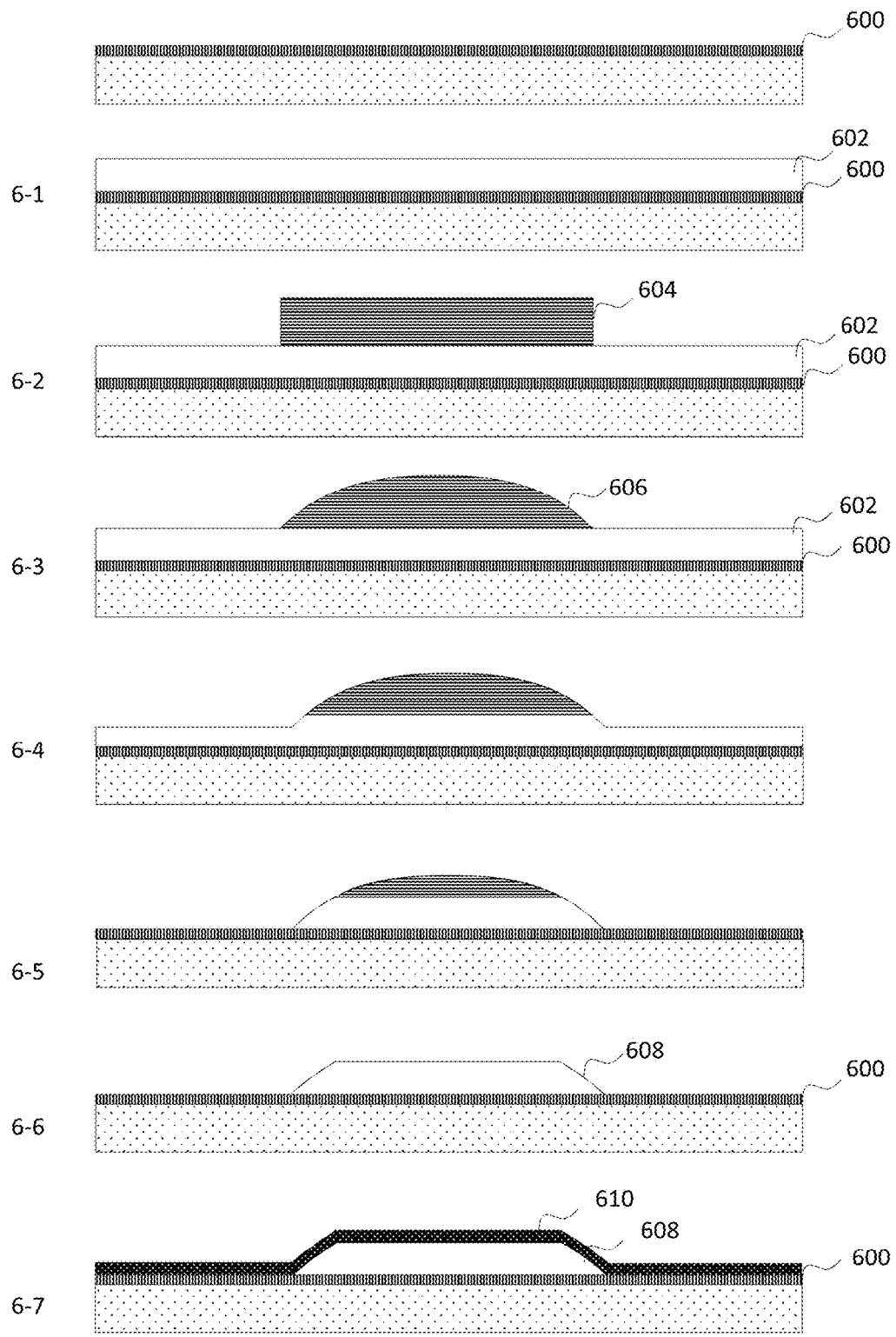
FIG. 6 illustrates stages in an embodiment of the method of FIG. 5.

FIG. 6 illustrates stages in an embodiment of the method of FIG. 5. In the embodiment, the form of the tapered element of bulk material is achieved by photoresist reflow process. The starting point of the process is again the electrode substrate 600. In the beginning, a uniform layer of bulk material 602 (cf. Lins) may be deposited (stage 6-1) on the electrode substrate, and a photoresist layer element 604 (cf. Lres) is patterned on the layer of bulk material (stage 6-2).

Figure 7:
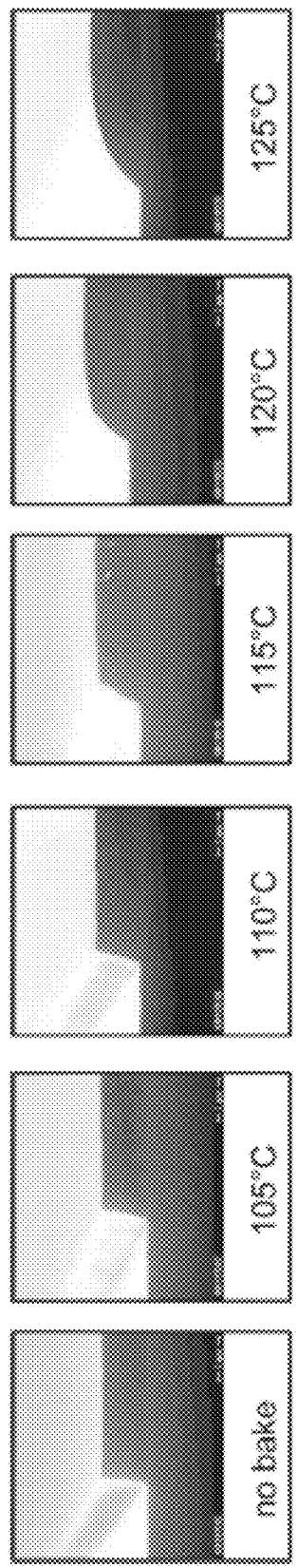
FIG. 7 illustrates thermal reflow with cross-section of resist structures at increasing bake temperatures.

In order to achieve the desired tapered form, the photoresist layer element 604 is thermally reflowed (stage 6-3), resulting into a tapered photoresist element 606 that is lower at the edges than in the middle. The thermal reflow of photoresist structures is a process known e.g. from micro-optics where it is used to transfer controllably lense-shaped structures into substrates. At increasing bake temperatures and times, side walls of an initially rectangular photoresist structure assumes a tilted or rounded form. The resulting tilted or rounded form of the tapered photoresist element 606 can be accurately controlled with reflow process parameters, like viscosity of the resist, temperature of the reflow baking, and/or duration of the reflow baking. As an example, FIG. 7 illustrates thermal reflow with cross-section of resist structures at increasing bake temperatures (source: AZ-EM® ECI 3000 Product Data Sheet of MicroChemicals). The thermal reflowing transforms the photoresist layer element into a tapered photoresist element that is thinner at the edges than in the middle.

When the desired form for the tapered photoresist element 606 is achieved, the tapered photoresist element and the layer of bulk material are non-selectively etched (stages 6-4 and 6-5) Non-selective etching in this context means that the etching removes material substantially at the same rate from the tapered photoresist element and from the layer of bulk material, as shown in stages 6-4 and 6-5. For example, when silicon dioxide ($SiO_2$) is etched with carbon tetrafluoride ($CF_4$, also known as tetrafluoromethane) or with trifluoromethane ($CHF_3$, also known as methyl trifluoride) the rate of etching of the resist may be controlled by means of added oxygen ($O_2$). As a result, the specific form of the tapered photoresist element may be maintained during the etching and transferred to the structure of the protrusion that remains on the electrode substrate after etching. The form of the tapered photoresist element is thus transferred in stages 6-4 and 6-5 to the underlying layer of bulk material. The form shown in FIG. 3 may be achieved by removing (stage 6-6) any photoresist material that remains on the tapered element after the non-selective etching. The form shown in FIG. 4 may be achieved by adjusting the initial thickness of the photoresist element such that the layer of photoresist element is fully removed at the same time with the bulk material layer.

The at least mildly conductive or semi-insulating DLC coating 610 may then be deposited (stage 6-7) with directed energy beam plasma enhanced chemical vapor deposition processes onto the tapered element of bulk material. The tapered element of bulk material forms the inner part 110 of the impact element 108 and the conductive DLC coating the outer part 112 of the impact element 108 of FIGS. 3 and 4. It is noted that FIG. 6 is only illustrative and not in scale. In practical applications, the thickness of the DLC coating 610 is much less than the height of the inner element 608.

It is noted that only stages of the manufacturing process necessary to describe features of the present embodiment are shown in FIG. 6. The manufacturing process of the impact element, and of the sensor device with such impact element as a whole may include actions that take place before, after and/or in between the disclosed process stages, but are not separately disclosed herein. Manufacturing processes of semiconductor structures are described in detail in the state of the art and are as such well known to a person skilled in the art.

Figure 8:
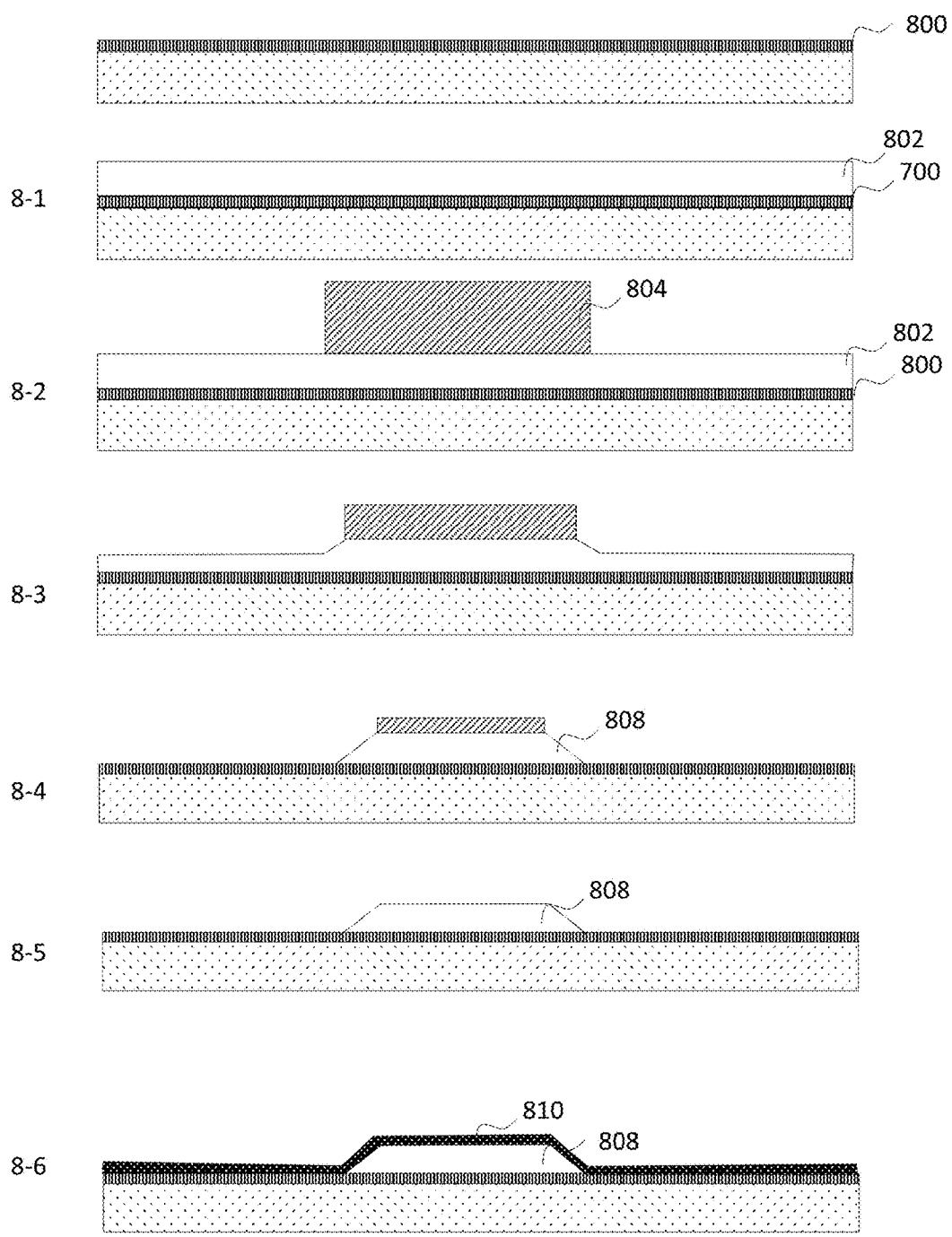
FIG. 8 illustrates stages in an alternative embodiment of the method of FIG. 5.

FIG. 8 illustrates stages in an alternative embodiment of the method of FIG. 5. The starting point of the process is again the electrode substrate 800. In the beginning, a uniform layer 802 of bulk material (insulating, or highly resistive material), may be deposited (stage 8-1) on the electrode substrate, and a photoresist layer element 804 may be created on the layer of bulk material (stage 8-2). The etching process, the material of the photoresist layer element and the bulk material are selected such that a tapered form is patterned into the underlying layer. With non-reactive plasma etching, novolack based thick photoresist, using CF4/CHF3/O2 plasma chemistry, the isotropic photresist etch rate and selectivity can be adjusted with oxygen flow rate. For example, the selection may be made such that material is removed quicker from the photoresist layer element 804 than from the bulk material, and the etching process removes material isotropically from all exposed surfaces of the photoresist layer element 804. The photoresist layer element 804 is preferably initially thicker than the layer of bulk material 802. When material is removed from the top surface and also from the side surfaces of the photoresist layer element during etching, parts of the layer of bulk material that are initially under the photoresist layer element become gradually exposed to the etching (stages 8-3). The slope of the side walls can be controlled by varying parameters of the etching process during the process. Due to this gradual exposure, a protrusion 808 with a sloped side wall is created (stage 8-4) on the base. The excess photoresist may be removed (stage 8-5) and the protrusion is applicable as the tapered element of bulk material that forms the inner part 110 of the impact element 108 of FIG. 3. A conductive DLC coating 810 may then be deposited (stage 8-6) with directed energy beam plasma enhanced chemical vapor deposition process onto the tapered element of bulk material. The conductive DLC coating 810 then correspondingly forms the outer part 112 of the impact element 108 of FIGS. 3 and 4. It is noted that also FIG. 8 is only illustrative and not in scale. In practical applications, the thickness of the DLC coating 810 is much less than the height of the inner element 808.

Other methods for fabrication of controlled side wall angles in thin films may also be applied within the scope. Examples of such methods include laser ablation, anisotropic wet etching, isotropic wet etching, modified reactive ion etching, and isotropic etching of a two-layer system. These method are documented in the prior art and known as such to a person skilled in the art.

Figure 9:
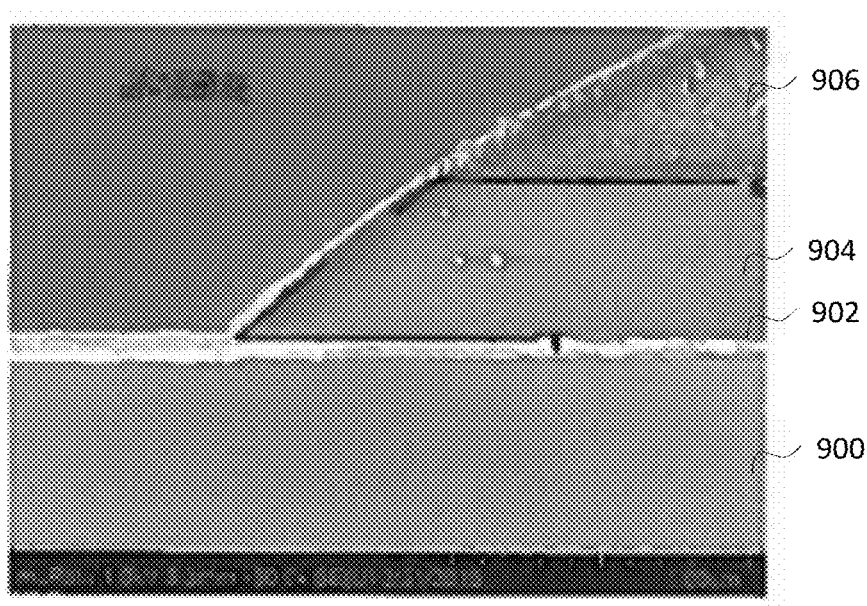
FIG. 9 shows an image of a reflowed photoresist layer element and the layer of bulk material after a period of non-selective etching.

FIG. 9 shows an image of a reflowed photoresist layer element and the layer of insulating material after a period of non-selective etching. Layers in the image include a substrate layer 900, a conductive metal layer 902, a layer of bulk material 904, and a layer of photoresist material 906. The image shows an edge of a tapered photoresist element that is formed of the photoresist material 906, and an edge of a tapered impact element formed of the layer of bulk material 908. FIG. 9 shows the transfer of the quite accurately tilt angle of the reflowed photoresist to the form of the protrusion formed of the bulk material. The image shows also that the reflow process results into a smooth side surface, due to which the successive DLC coating is even also in the tilted side surfaces. In the rectilinear or very steep-sided prior art structures, such smoothness is not achieved, and the DLC layer over the protrusion performs less consistently in discharging static buildup. Furthermore, materials applicable for use in the bulk layer are typically brittle. This means that when the force of the impact exceeds a limit, the bulk material tends to crush. The hard and durable DLC coating distributes the force of impact to a larger area, whereby the risk of damage is reduced. The smoother and thus more uniform DLC layer improves even more effectively the mechanical strength and durability of the impact element.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A sensor device including:
an inertial mass carrying a movable electrode;
a base including a stationary electrode opposite the inertial mass;
wherein
the inertial mass is suspended to enable movement towards the stationary electrode;
the base includes an impact element that extends towards the inertial mass;
the impact element includes an inner part of bulk material and an outer part of diamond-like coating material, wherein
the inner part is lower at the edges than in the middle;
the outer part is formed of a diamond-like carbon layer that covers the inner part.

2. The sensor device of claim 1, wherein
the inertial mass extends as a plane in two in-plane directions;
the sensor device includes a suspending spring structure that enables displacements of the inertial mass in an out-of-plane direction, wherein the out-of-plane direction is perpendicular to the in-plane directions.

3. The sensor device of claim 2, wherein the suspending spring structure is configured to enable rotation of the inertial mass about an axis aligned to the plane of the inertial mass.

4. The sensor device of claim 2, wherein the suspending spring structure is configured to enable transversal motion of the inertial mass in the out-of-plane direction.

5. The sensor device of claim 1, wherein
a first gap is formed between a surface of the stationary electrode and a surface of the movable electrode;
a second gap is formed between a top surface of the impact element and a surface of the movable electrode;
the second gap is smaller than the firstgap.

6. The sensor device of claim 1, wherein the diamond-like carbon layer that covers the inner part extends to cover also at least part of a surface of the stationary electrode next to the impact element.

7. The sensor device of claim 1, wherein a side wall of the impact element in a cross-section forms a tilt angle with the surface of the stationary electrode.

8. The sensor device of claim 7, wherein side walls of the impact element have a substantially linear form and a line running along the side wall in a cross-section forms the tilt angle with the surface of the stationary electrode.

9. The sensor device of claim 7, wherein side walls of the impact element have a substantially curved form and the tilt angle of the side wall is the largest angle formed by a tangent of the side wall in a cross-section of the impact element with the surface of the stationary electrode.

10. The sensor device of claim 7, wherein the tilt angle is less than 80°, preferably less than 70°.

11. A method of manufacturing an impact element on an electrode substrate covered by a layer of bulk material, the method comprising:
creating a photoresist layer element on the layer of bulk material;
etching the photoresist layer element and the layer of bulk material such that a tapered element of bulk material protruding from the electrode substrate is formed, the tapered element being lower at the edges than in the middle;
depositing a diamond-like carbon coating at least onto the tapered element of bulk material.

12. The method of claim 11, further comprising depositing the conductive diamond-like coating in a directed energy beam plasma enhanced chemical vapour deposition process.

13. The method of claim 11, further comprising
thermally reflowing the photoresist layer element into a tapered photoresist layer element that is thinner at the edges than in the middle;
etching non-selectively the tapered photoresist layer element and the layer of bulk material such that the tapered element is formed.

14. The method of claim 11, further comprising using in the photoresist layer element a material that etches quicker than the bulk material.

* * * * *